United States Patent
Kim et al.

(10) Patent No.: US 11,804,157 B2
(45) Date of Patent: Oct. 31, 2023

(54) ELECTROLUMINESCENT DISPLAY APPARATUS AND DISPLAY DEFECT DETECTION METHOD THEREOF

(71) Applicant: LG Display Co., Ltd., Seoul (KR)

(72) Inventors: Sun Yoon Kim, Paju-si (KR); Jin Hyun Jung, Paju-si (KR); Chang Woo Lee, Paju-si (KR); Hyun Wook Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/980,420

(22) Filed: Nov. 3, 2022

(65) Prior Publication Data
US 2023/0186805 A1 Jun. 15, 2023

(30) Foreign Application Priority Data
Dec. 13, 2021 (KR) .................. 10-2021-0177968

(51) Int. Cl.
*G09G 3/30* (2006.01)
*G09G 3/00* (2006.01)
*G09G 3/3233* (2016.01)
*G09G 3/3291* (2016.01)
*G01R 19/10* (2006.01)

(52) U.S. Cl.
CPC .......... *G09G 3/006* (2013.01); *G01R 19/10* (2013.01); *G09G 3/3233* (2013.01); *G09G 3/3291* (2013.01); *G09G 2300/0819* (2013.01); *G09G 2300/0842* (2013.01); *G09G 2310/08* (2013.01); *G09G 2330/021* (2013.01); *G09G 2360/10* (2013.01)

(58) Field of Classification Search
CPC ........... G09G 3/006; G09G 3/30–3291; G09G 2300/0819; G09G 2300/0842; G09G 2310/08; G09G 2330/021; G09G 2360/10
See application file for complete search history.

(56) References Cited

U.S. PATENT DOCUMENTS

| 10,565,909 | B2 | 2/2020 | Xu et al. |
| 10,996,258 | B2 | 5/2021 | Chaji et al. |
| 2005/0285822 | A1* | 12/2005 | Reddy ............... H10K 59/13 345/76 |
| 2007/0075939 | A1* | 4/2007 | Cho .................. G09G 3/3233 345/76 |
| 2008/0055211 | A1 | 3/2008 | Ogawa |

(Continued)

FOREIGN PATENT DOCUMENTS

| CN | 106910465 A | 6/2017 |
| CN | 108269537 A | 7/2018 |

*Primary Examiner* — Sanghyuk Park
(74) *Attorney, Agent, or Firm* — Birch, Stewart, Kolasch & Birch, LLP

(57) ABSTRACT

An electroluminescent display apparatus can include a display panel including the one or more subpixels connected to a data line, a gate line, and a low-level power line. The display apparatus can further include a comparator connected to the one or more subpixels through the data line and the low-level power line to compare a first input voltage from the data line with a second input voltage from the low-level power line to generate a comparison output. The first input voltage is a reference voltage, and the second input voltage is a voltage of a specific node of the one or more subpixels capable of being shifted from an initialization voltage.

25 Claims, 8 Drawing Sheets

(56) References Cited

U.S. PATENT DOCUMENTS

| | | | |
|---|---|---|---|
| 2010/0073265 A1* | 3/2010 | Hirai | G09G 3/325 |
| | | | 345/55 |
| 2015/0187278 A1 | 7/2015 | Park | |
| 2016/0155380 A1* | 6/2016 | Kwon | G09G 3/3233 |
| | | | 345/78 |
| 2017/0045972 A1* | 2/2017 | Xu | H10K 59/1216 |
| 2019/0340966 A1 | 11/2019 | Lee et al. | |
| 2023/0095234 A1 | 3/2023 | Lee et al. | |

\* cited by examiner

ELECTROLUMINESCENT DISPLAY APPARATUS AND DISPLAY DEFECT DETECTION METHOD THEREOF

CROSS-REFERENCE TO RELATED APPLICATIONS

This application claims priority to Korean Patent Application No. 10-2021-0177968 filed in the Republic of Korea on Dec. 13, 2021, the entire contents of which are hereby expressly incorporated by reference into the present application.

BACKGROUND

Field

The present disclosure relates to an electroluminescent display apparatus and a display defect detection method thereof.

Discussion of the Related Art

Electroluminescent display apparatuses are categorized into inorganic light emitting display apparatuses and organic light emitting display apparatuses on the basis of a material of an emission layer. Each subpixel of the electroluminescent display apparatuses includes a light emitting device for self-emitting light and controls an amount of light emitted from the light emitting device with a data voltage based on a gray level of image data to adjust luminance.

When a subpixel degrades as a driving time elapses, a hot spot defect can occur due to an abnormal short circuit. In this case, a separate detection line can be needed for detecting a defective subpixel recognized as a hot spot. Here, a pixel array can be complicated and/or an aperture ratio of a panel can be reduced. The aperture ratio is the ratio of a light-emitting area of a pixel to a total area of the pixel.

SUMMARY OF THE DISCLOSURE

To address the aforementioned and other limitations of the related art, the present disclosure can provide an electroluminescent display apparatus and a display defect detection method thereof, which can detect a defective subpixel caused by an abnormal short circuit without a separate detection line.

To achieve these objects and other advantages and in accordance with the purpose of the disclosure, as embodied and broadly described herein, an electroluminescent display apparatus can include a display panel including at least one subpixel connected to a data line, a gate line, and a low-level power line, and a comparator connected to the at least one subpixel through the data line and the low-level power line to compare a first input voltage from the data line with a second input voltage from the low-level power line to generate a comparison output, wherein the first input voltage is a reference voltage, and the second input voltage is a voltage of a specific node of the at least one subpixel capable of being shifted from an initialization voltage.

In another aspect of the present disclosure, a display defect detection method of an electroluminescent display apparatus is provided, where the electroluminescent display apparatus includes at least one subpixel connected to a data line, a gate line, and a low-level power line. The method can include receiving a first input voltage through the data line and a second input voltage through the low-level power line, and comparing the first input voltage with the second input voltage to generate a comparison output, wherein the first input voltage is a reference voltage, and the second input voltage is a voltage of a specific node of the at least one subpixel capable of being shifted from an initialization voltage.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE EMBODIMENTS

Figure 1:
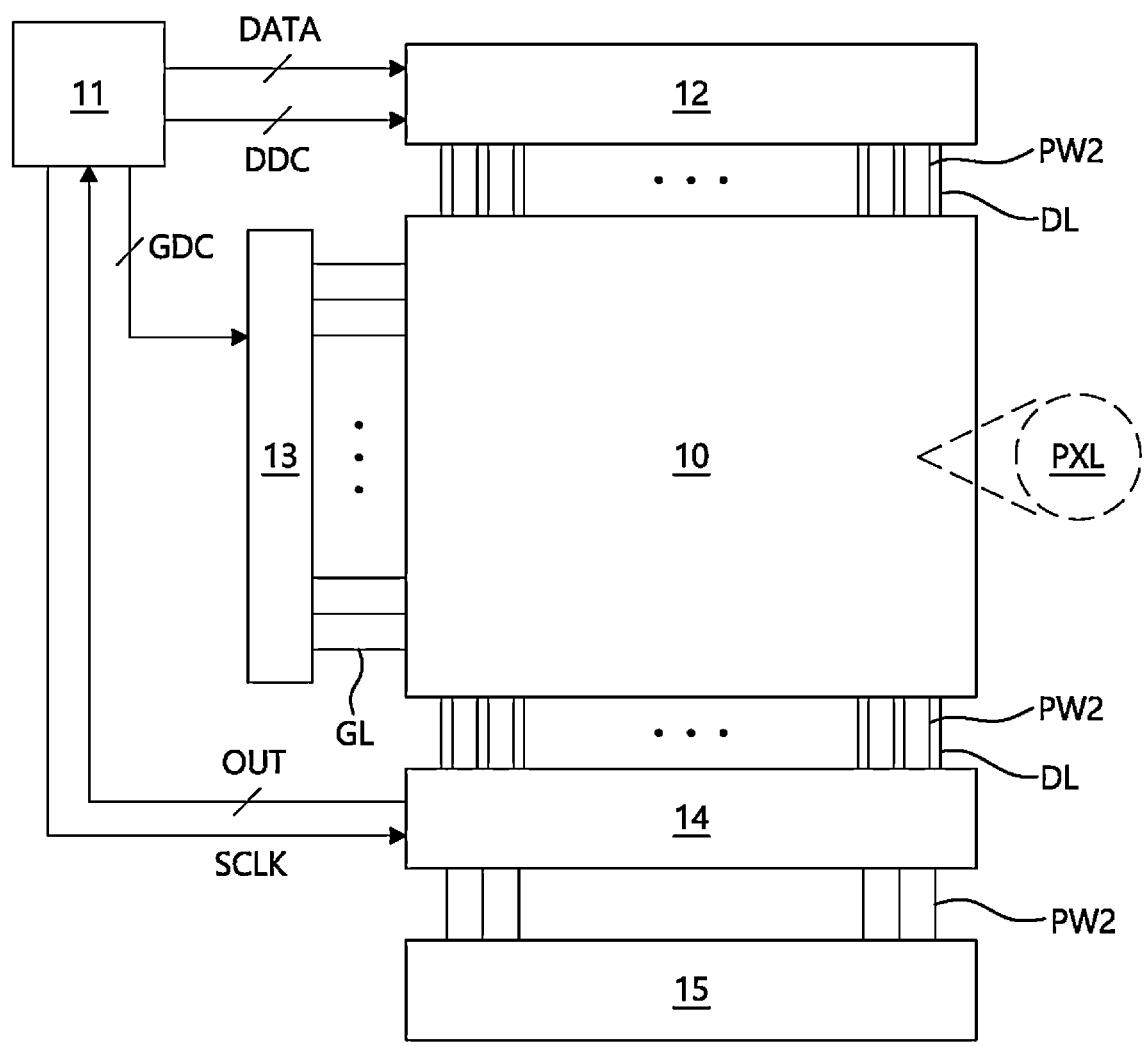
FIG. 1 is a block diagram illustrating an electroluminescent display apparatus according to an embodiment of the present disclosure.

Hereinafter, exemplary embodiments of the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of a relevant known function or configuration is determined to unnecessarily obscure the point of the present disclosure, the detailed description will be omitted or may be provided briefly.

According to various embodiments of the present disclosure, an electroluminescent display apparatus will be discussed below. All the components of each electroluminescent display apparatus according to all embodiments of the present disclosure are operatively coupled and configured.

FIG. 1 is a block diagram illustrating an electroluminescent display apparatus according to an embodiment of the present disclosure.

Referring to FIG. 1, the electroluminescent display apparatus according to the embodiment can include a display panel 10, a timing controller 11, a data driver 12, a gate driver 13, a defect detection circuit 14, and a power circuit 15.

In a screen area displaying an input image on the display panel 10, data lines DL extending in a column direction (or a vertical direction) can intersect with gate lines GL extending in a row direction (or a horizontal direction), and pixels PXL can be arranged as a matrix type in a plurality of intersection areas to configure a pixel array. In the pixel array, low-level power lines PW2 can extend in a column direction, and a plurality of subpixels arranged in the same column line as one another can be connected to the same low-level power line PW2. Each of the low-level power lines PW2 and the data lines DL can be connected to subpixels adjacent thereto in the column direction, and each of the gate lines GL can be connected to subpixels adjacent thereto in the row direction. A plurality of subpixels can configure one pixel PXL.

When a subpixel degrades as a driving time elapses, a hot spot defect which can be caused by an abnormal short circuit can occur. A low-level power line PW2 and a data line DL can be used to detect the occurrence or not of a defect in a subpixel, and thus, a separate detection line may not be needed.

The timing controller 11 can receive a timing signal such as a vertical synchronization signal Vsync, a horizontal synchronization signal Hsync, a data enable signal DE, and a dot clock DCLK from a host system to generate timing control signals for controlling an operation timing of each of the data driver 12 and the gate driver 13. The timing control signals can include a gate timing control signal GDC for controlling the gate driver 13 and a data timing control signal DDC for controlling the data driver 12.

The data driver is arranged to supply a data voltage (i.e. video data DATA) via the data line to the subpixels, wherein the level of the data voltage is based on the comparison output. For example, the timing controller 11 can receive video data DATA from the host system and can receive a comparison output OUT from the defect detection circuit 14 (for example from a comparator COMP). When the comparison output OUT is input to the timing controller, the timing controller 11 can execute a dark spot processing algorithm (defective subpixel compensation algorithm) to modulate the video data DATA which is to be input to a corresponding defective subpixel. When at least one of subpixels configuring one pixel PXL is defective, the one pixel PXL can be determined to be defective. In this case, the timing controller 11 can substitute only video data DATA which is to be applied to a defective subpixel into black grayscale data, or can substitute all video data DATA which is to be applied to one pixel PXL having a defect into black grayscale data. The timing controller 11 can supply the data driver 12 with black grayscale data for dark spot processing and the other video data DATA.

The timing controller 11 can temporally divide display driving and detection driving on the basis of the timing control signals DDC and GDC. The display driving can be an operation of applying video data DATA, including black grayscale data, to pixels PXL so as to display an input image on the screen. The detection driving can be an operation of detecting a defective subpixel for performing dark spot processing on the defective subpixel.

The defect detection circuit 14 can receive a sampling clock SCLK from the timing controller 11 that causes output of the comparison output OUT to the timing controller.

The display driving can be performed in a vertical active period where the data enable signal DE is shifted from a logic high-level to a logic low-level in one frame. On the other hand, the detection driving can be performed in a state where a screen of the display panel is turned off. For example, the detection driving can be performed in a power on period until before screen reproduction starts from after a system main power is applied, or can be performed in a power off period until before the system main power is released from after the screen reproduction ends. The power on period can be a period of time that occurs before a screen reproduction starts, but after a system main power is applied to the display apparatus. The power off period can be a period of time after screen reproduction ends, but before the system main power is removed from the display apparatus. Screen reproduction can be described as a period of time when the screen area is displaying an input image on the display panel.

The data driver 12 can be connected to subpixels through the data lines DL. The data driver 12 can generate data voltages needed for display driving or detection driving of subpixels and can supply the data voltages to the data lines DL, on the basis of the data timing control signal DDC. A data voltage for the display driving can be a digital-to-analog conversion result of the video data DATA, and to this end, the data driver 12 can include a plurality of digital-to-analog converters. A data voltage (Vdata of FIG. 4) for the detection driving can be a detection data voltage having an off level (VOFF of FIG. 4) and a detection reference voltage. Each of the detection data voltage and the detection reference voltage can be a voltage which is fixed or preset regardless of the video data DATA. In the detection driving, the data driver 12 can supply the detection data voltage to the data lines DL, and then, can supply the detection reference voltage to the data lines DL. The detection reference voltage can include a first reference voltage (VL of FIG. 4) and a second reference voltage (VH of FIG. 4) which differ.

The data driver 12 can be configured with a plurality of source driving integrated circuits (ICs). Each of the source ICs can be mounted on a flexible circuit film and can be bonded to the display panel 10, and moreover, can include a shift register, a latch, the digital-to-analog converters, and an output buffer. Each source IC can further include a separate circuit for generating the detection data voltage and the detection reference voltage.

The gate driver 13 can be connected to subpixels through the gate lines GL.

In the display driving, the gate driver 13 can generate scan signals on the basis of the gate timing control signal GDC and can respectively supply the scan signals to the gate lines GL on the basis of a data voltage supply timing. A horizontal display line to which a data voltage is to be supplied can be selected by the scan signal. Each of the scan signals can be generated in a pulse form which swings between a gate on level and a gate off level. A scan signal having an on level can be set to a voltage which is higher than a threshold voltage of a transistor, and a scan signal having an off level can be set to a voltage which is lower than the threshold voltage of the transistor. A transistor included in a subpixel can be turned on in response to a scan signal having an on level and can be turned off in response to a scan signal having an off level.

Furthermore, in the detection driving, the gate driver 13 can generate a detection scan signal (SCAN of FIG. 4) on the basis of the gate timing control signal GDC and can supply the detection scan signal to a predetermined gate line GL. A horizontal display line to which a detection data voltage is to be supplied can be selected by the detection scan signal.

The gate driver 13 can include a gate shift register including a plurality of output stages. The gate shift register can be provided in a bezel area outside the screen area of the display panel 10. The plurality of output stages of the gate shift register can be connected to one another through cascade and can transfer and receive a carry signal. The plurality of output stages can be independently connected to the gate lines GL and can output the scan signals to the gate lines GL.

The gate driver 13 can include a level shifter which converts the gate timing control signal GDC with a swing width of an on level and an off level and supplies a converted gate timing control signal GDC to the gate shift register. The level shifter can be mounted on a printed circuit board (PCB) electrically connected to the display panel 10. The gate timing control signal GDC generated by the timing controller swings with the transistor-to-transistor level (TTL). The level shifter converts the TTL of the gate timing control signal GDC to on and off levels. The voltage swing width of on and off level is larger than the voltage swing width of TTL.

The defect detection circuit 14 can be connected to a subpixel through the data line DL and the low-level power line PW2. In the detection driving, the defect detection circuit 14 can be supplied with a first input voltage through the data line DL and can be supplied with a second input voltage through the low-level power line PW2. The defect detection circuit 14 can compare the first input voltage with the second input voltage to generate the comparison output OUT. Here, the first input voltage can be the detection reference voltage, and the second input voltage can be a voltage of a specific node (for example, a source node) of a subpixel capable being shifted from a predetermined or preset initialization voltage. The voltage of the specific node can be capable of being shifted from the initialization voltage due to, for example, a defect in the pixel which causes a charging or discharging of the specific node even though the specific node is floated by being disconnected from other lines (e.g. disconnected from an initialization power terminal and a low-level power terminal as described herein).

In the detection driving, the detection data voltage has an off level and the initialization voltage can be applied to a corresponding subpixel. A driving element included in the corresponding subpixel can be turned off by the detection data voltage having an off level, and thus, a driving current may not flow in the driving element. At this time, the specific node connected to the driving element can be floated (e.g. in the absence of any connection to the initialization power terminal or low-level power terminal), and thus, the specific node should maintain the applied initialization voltage if any of the various types of abnormal short circuit defects do not occur in the corresponding subpixel. However, if various types of abnormal short circuit defects occur in the corresponding subpixel, the voltage of the specific node may not be maintained at the initialization voltage and can be lower or higher than the initialization voltage (e.g. by decreasing or increasing therefrom over a time period). The defect detection circuit 14 can receive, through the low-level power line PW2, a voltage of a specific node of a corresponding subpixel capable being shifted from an initialization voltage as described above.

The power circuit 15 can generate a high-level driving voltage and a low-level driving voltage for the display driving of a subpixel. The power circuit 15 can generate the initialization voltage needed for the detection driving of a subpixel. In the detection driving, the power circuit 15 can supply the initialization voltage to a specific node of a subpixel through the low-level power line PW2.

Figure 2:
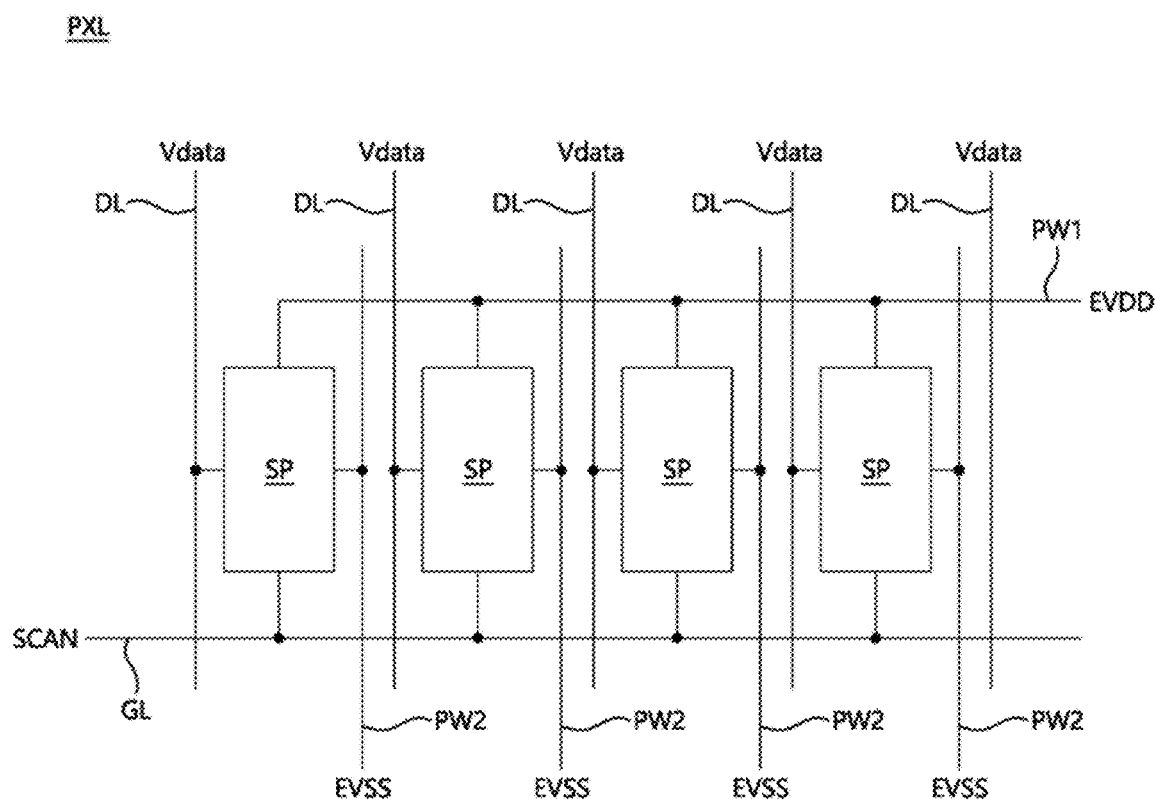
FIG. 2 is a diagram illustrating a connection configuration of a pixel according to an embodiment of the present disclosure.

FIG. 2 is a diagram illustrating a connection configuration of a pixel PXL according to an embodiment of the present disclosure.

Referring to FIG. 2, the pixel PXL according to an embodiment can include a plurality of subpixels SP. The plurality of subpixels SP can configure one pixel PXL to implement various color combinations. The plurality of subpixels SP can include red (R), green (G), blue (B), and white (W) subpixels SP, but are not limited thereto.

Each of the subpixels SP can include a light emitting device which is an inverted organic light emitting diode (OLED). The inverted OLED can be supplied with the high-level driving voltage as a common voltage, and thus, anode electrodes of all OLEDs of the subpixels SP configuring the one pixel PXL can be connected to a high-level power terminal EVDD through a common high-level power line PW1.

The subpixels SP configuring the one pixel PXL can be connected to a low-level power terminal EVSS through different low-level power lines PW2. The different low-level power lines PW2 can be physically apart from one another, and thus, can each be used as a detection line.

The subpixels SP configuring the one pixel PXL can be connected to the data driver through different data lines DL, and thus, can be supplied with a data voltage Vdata from the data driver. The data lines DL can be physically apart from one another, and thus, can each be used as a detection line.

The subpixels SP configuring the one pixel PXL can be connected to the gate driver through one gate line GL, and thus, can be supplied with a scan signal SCAN from the gate driver.

Figure 3:
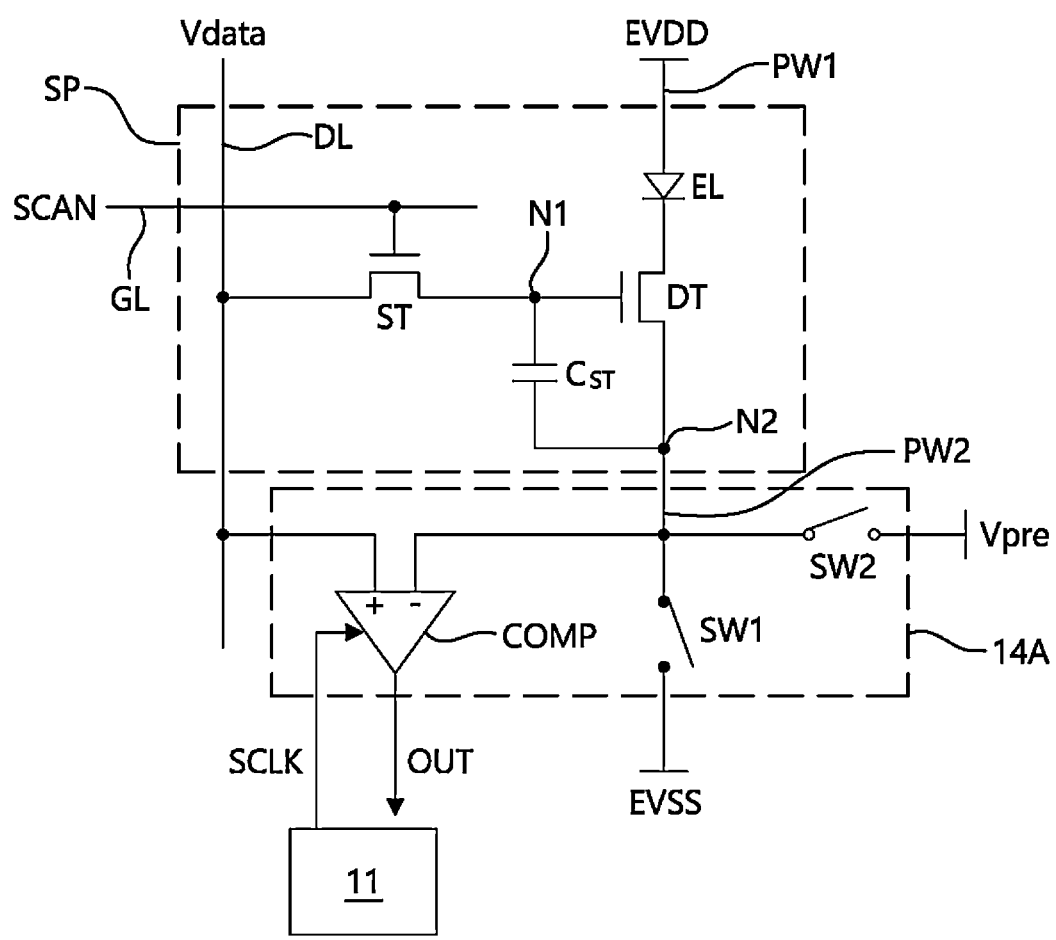
FIG. 3 is a diagram illustrating a connection configuration between a subpixel and a defect detection circuit according to an embodiment of the present disclosure.

FIG. 3 is a diagram illustrating a connection configuration between a subpixel SP and a defect detection circuit according to an embodiment of the present disclosure.

Referring to FIG. 3, the subpixel SP can include a light emitting device EL, a driving element DT, a switch element ST, and a storage capacitor Cst and can be implemented as an inverted type. The reason that the subpixel SP is implemented as the inverted type can be for using low-level power lines PW2 as detection lines. Further, when the subpixel SP is implemented as the inverted type, a structure of the subpixel SP can be simplified, and thus, an aperture ratio of a display panel having a high resolution and a large area can easily increase.

The light emitting device EL can be implemented as an OLED. An anode electrode of the OLED can be connected to a high-level power terminal EVDD through a common high-level power line PW1, and a cathode electrode of the OLED can be connected to one electrode of the driving element DT.

The driving element DT can include a gate electrode connected to a first node N1 (a gate node), a drain electrode (a first electrode) connected to a cathode electrode of the light emitting device EL, and a source electrode (a second electrode) connected to a second node N2 (a source electrode). Here, the second node N2 can be a specific node which is to be detected. Hereinafter, a specific node can be referred to as a source node.

The switch element ST can be connected between a data line DL and the first node N1 and can be turned on/off based on the scan signal SCAN supplied through a gate line GL.

The storage capacitor Cst can be connected to the first node N1 and the second node N2 and can hold a gate-source voltage of the driving element DT.

Referring to FIG. 3, the subpixel SP can be connected to a defect detector 14A through the data line DL and the low-level power line PW2. The defect detector 14A can include a comparator COMP, a first switch SW1, and a second switch SW2.

A first input terminal (+) of the comparator COMP can be connected to the data line DL, and a second input terminal (−) thereof can be connected to the low-level power line PW2. The comparator COMP can receive a first input voltage through the data line DL, a second input voltage through the low-level power line PW2, and the sampling clock SCLK from the timing controller 11. The first input voltage can be a predetermined detection reference voltage, and the second input voltage can be a voltage of the source node N2 of the subpixel SP.

The comparator COMP can compare the detection reference voltage with a voltage of the source node N2 on the basis of the sampling clock SCLK to generate a comparison output OUT. For example, the comparison output OUT is output in response to the sampling clock signal SCLK. The comparator COMP can transfer the comparison output OUT to the timing controller 11. The timing controller 11 can determine the occurrence or not of a defect of the subpixel SP and a defect type on the basis of a logic value of the comparison output OUT. To this end, a defect type table predetermined through an experiment can be previously stored. The timing controller 11 can execute a dark spot processing algorithm for a defective subpixel to modulate video data DATA which is to be input to a corresponding defective subpixel.

The first switch SW1 can supply the source node N2 of the subpixel SP with a low-level driving voltage needed for driving of the subpixel SP. The first switch SW1 can be connected between the low-level power line PW2 and the low-level power terminal EVSS. The first switch SW1 can maintain an on state in display driving and can maintain an off state in detection driving. The first switch SW1 can be turned off in the detection driving, and thus, the low-level power line PW2 can be used as a detection line.

The second switch SW2 can supply an initialization voltage Vpre to the source node N2 of the subpixel SP. The second switch SW2 can be connected between the low-level power line PW2 and an initialization power terminal. The second switch SW2 can be turned on in an initialization period of the detection driving and can be turned off in the other period of the detection driving.

Figure 4:
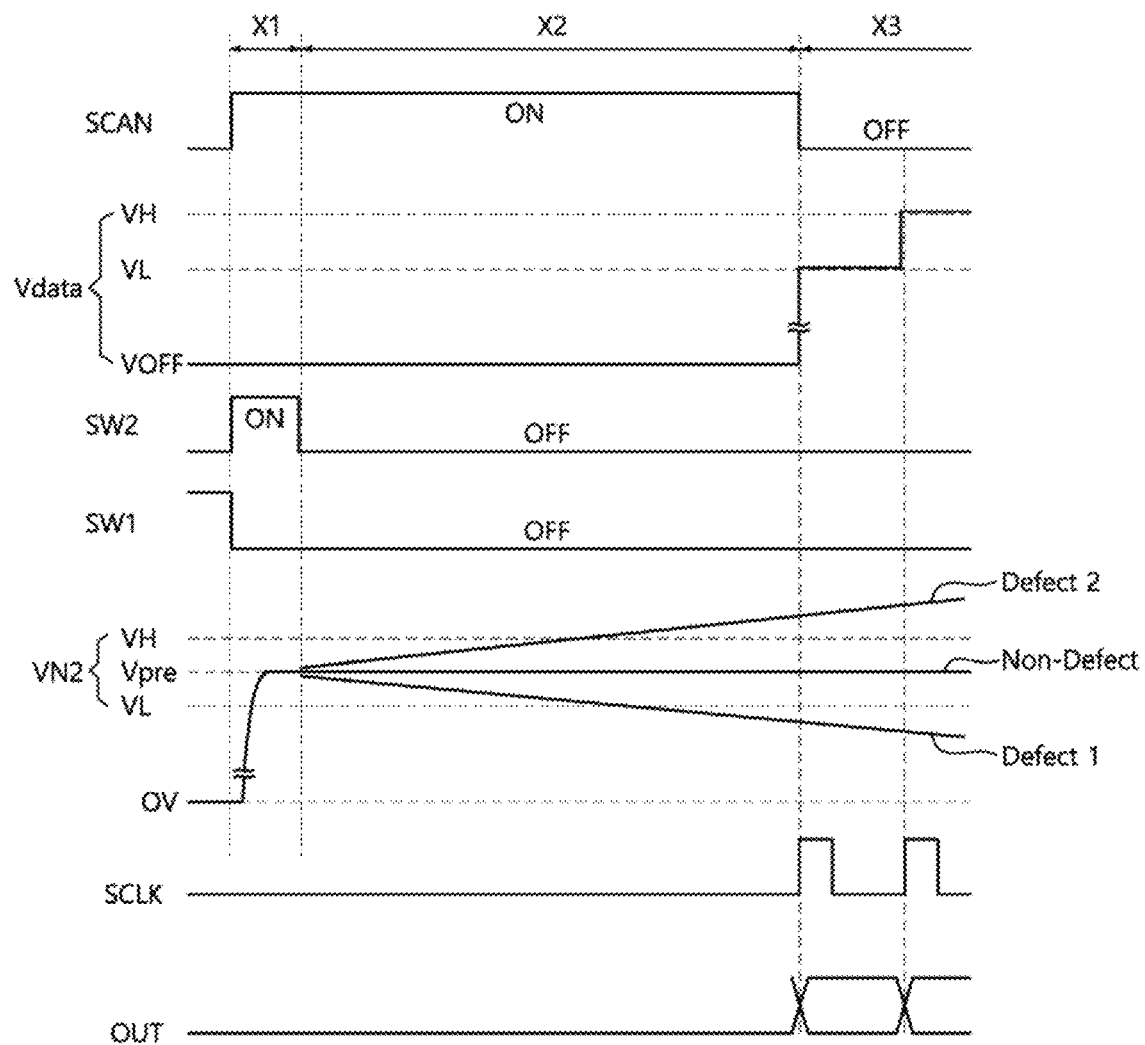
FIG. 4 is a diagram illustrating an operation waveform of each of a subpixel and a defect detection circuit according to an embodiment of the present disclosure.

FIG. 4 is a diagram illustrating an operation waveform of each of a subpixel and a defect detection circuit according to an embodiment of the present disclosure.

Referring to FIG. 4, detection driving can be performed in the order of an initialization period X1, a transition period X2, and a detection period X3.

A scan signal SCAN applied to a subpixel SP can have an on level in the initialization period X1 and the transition period X2 and can have an off level in the detection period X3.

The first switch SW1 included in the defect detector 14A can maintain an off state in the initialization period X1, the transition period X2, and the detection period X3.

The second switch SW2 included in the defect detector 14A can maintain an on state in the initialization period X1 and can maintain an off state in the transition period X2 and the detection period X3.

The data driver can supply a detection data voltage VOFF having an off level to the data line DL in the initialization period X1 and the transition period X2 and can supply a detection reference voltage to the data line DL in the detection period X3. The detection reference voltage can include a first reference voltage VR which is lower than an initialization voltage Vpre and a second reference voltage VH which is higher than the initialization voltage Vpre. The first reference voltage VL can be a detection reference voltage for detecting a first defect Defect 1 type (an underflow type) where a voltage VN2 of the source node is lower than the initialization voltage Vpre. The second reference voltage VH can be a detection reference voltage for detecting a second defect Defect 2 type (an overflow type) where the voltage VN2 of the source node is higher than the initialization voltage Vpre.

A first defect of the underflow type can be caused by a short circuit defect of a switch element of the subpixel SP and/or a short circuit defect of a storage capacitor of the subpixel SP. The short circuit defect of the switch element can include a gate-source short circuit, a gate-drain short circuit, and/or a drain-source short circuit of the switch element. The short circuit defect of the storage capacitor can denote short circuit between two electrodes configuring the storage capacitor.

A second defect of the overflow type can be caused by a short circuit defect of a driving element of the subpixel SP and/or a short circuit defect of a light emitting device of the subpixel SP. The short circuit defect of the driving element can include a gate-source short circuit, a gate-drain short circuit, and a drain-source short circuit of the driving element. The short circuit defect of the light emitting device can denote short circuit between an anode electrode and a cathode electrode of the light emitting device.

When a defect type described above occurs in the subpixel SP, the source node voltage VN2 of the subpixel SP may not maintain the initialization voltage Vpre and can be lower or higher than the initialization voltage Vpre in the transition period X2 and the detection period X3.

In the detection period X3, the data driver can supply the first reference voltage VL to the data line DL, and then, can supply the second reference voltage VH to the data line DL.

The comparator COMP can compare the first reference voltage VL with the source node voltage N2 of the subpixel SP on the basis of a first sampling clock SCLK (i.e. when the first sampling clock SCLK signal is at a high voltage for the first time as shown in the SCLK signal diagram in FIG. 4) to generate a first comparison output at a first timing of the detection period X3 as displayed on the OUT signal diagram in FIG. 4, and can compare the second reference voltage VH with the source node voltage N2 of the subpixel SP on the basis of a second sampling clock SCLK (i.e. when the second sampling clock SCLK is at a high voltage for the second time as shown in the SCLK diagram of FIG. 4) to generate a second comparison output at a second timing, succeeding the first timing and as displayed on the OUT signal diagram of FIG. 4, of the detection period X3. Each of the first comparison output and the second comparison output can be one of '1' indicating a high voltage and '0' indicating a low voltage. The sampling clock SCLK acts as a clock/latch which latches the OUT signal. For example, the OUT signal can rise to '1' (or fall to '0') from the time of the rising edge of the first sampling clock SCLK and if the OUT signal changes by the time of the second sampling clock SCLK, the OUT signal will fall to '0' (or rise to '1') from the time of the rising edge of the second sampling clock SCLK.

At the first timing of the SCLK signal, the comparator COMP can generate a high voltage '1' as the first comparison output when the source node voltage VN2 of the subpixel SP is lower than the first reference voltage VL and can generate a low voltage '0' as the first comparison output when the source node voltage VN2 of the subpixel SP is higher than or equal to the first reference voltage VL. This can be because the source node voltage VN2, which is a detection target voltage, of the subpixel SP is input to the second input terminal (−) of the comparator COMP.

At the second timing of the SCLK signal, the comparator COMP can generate the low voltage '0' as the second comparison output when the source node voltage VN2 of the subpixel SP is higher than the second reference voltage VH and can generate the high voltage '1' as the second comparison output when the source node voltage VN2 of the subpixel SP is lower than or equal to the second reference voltage VH.

The comparator COMP can transfer the first comparison output and the second comparison output to the timing controller 11. The timing controller 11 can determine the occurrence or not of a defect of the subpixel SP on the basis of a logic combination of the first comparison output and the second comparison output. In detail, only when the logic combination of the first comparison output and the second comparison output is (1,0), the timing controller 11 can determine that the subpixel SP is in a normal state, and otherwise, can determine that the subpixel SP is in a defective state.

Furthermore, when the logic combination is (1,1), the timing controller 11 can determine that the first defect of the underflow type occurs in the subpixel SP, and when the logic combination is (0,0), the timing controller 11 can determine that the second defect of the overflow type occurs in the subpixel SP.

FIGS. 5 to 8 are diagrams illustrating various examples of an arrangement position of a defect detection circuit. In FIGS. 5 to 8, 'SPCB' can represent a source printed circuit board, 'COF' can represent a flexible circuit film, and 'SIC' can represent a source IC.

Figure 5:
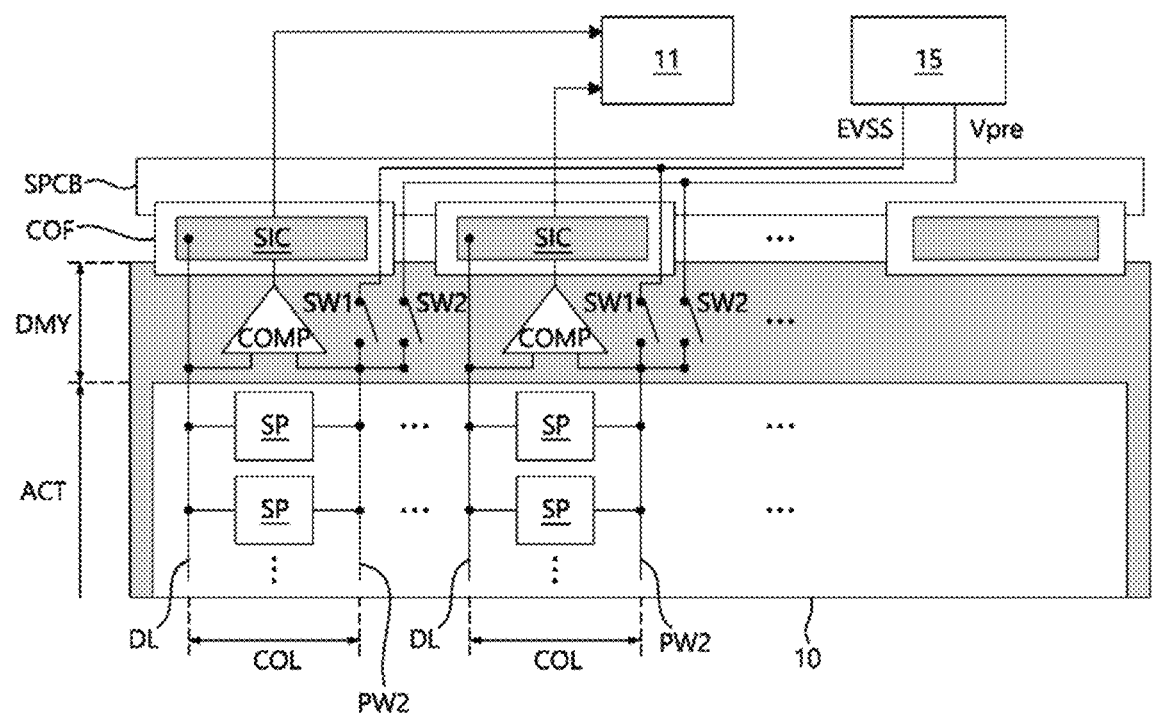
FIGS. 5 to 8 are diagrams illustrating various examples of an arrangement position of a defect detection circuit according to the present disclosure.
Figure 6:
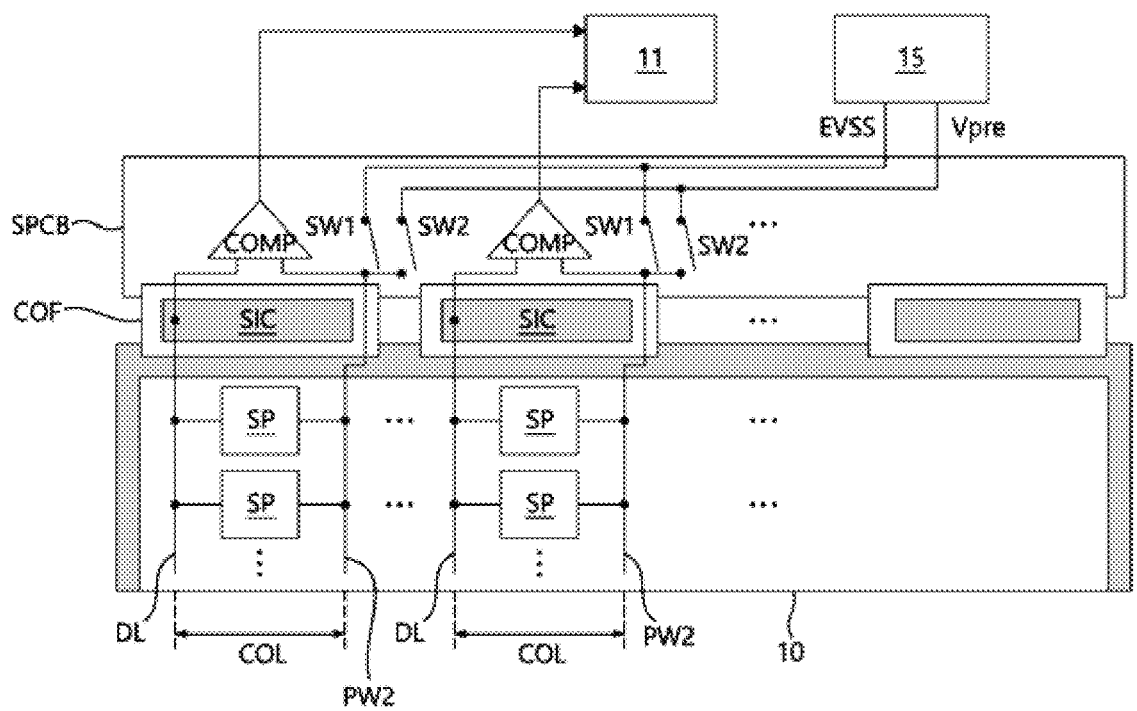
Figure 7:
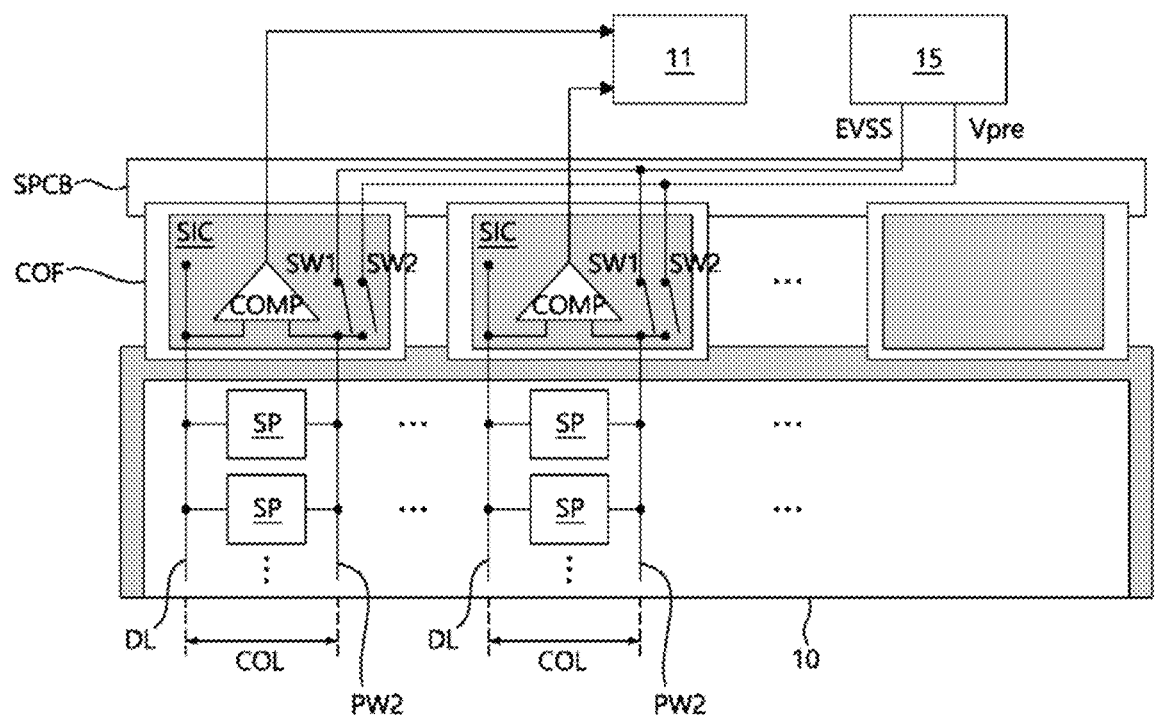

In FIGS. 5 to 7, the first switch SW1 is connected between the low-level power line PW2 and the low-level power terminal EVSS. The second switch SW2 is connected between the low-level power line PW2 and the initialization power terminal supplying the initialization voltage Vpre to the plurality of subpixels SP. The low-level power terminal EVSS is connected between the power circuit 15 and the first switch SW1, and the initialization power terminal is connected between the power circuit 15 and the second switch SW2.

In FIGS. 5 to 8, the output terminal of the comparator COMP is connected to the timing controller 11.

Referring to FIG. 5, the comparator COMP and the first and second switches SW1 and SW2 configuring the defect detector 14A can be disposed in a dummy area DMY, which does not display an image, of the display panel 10. Advantageously, this can allow the size of the source printed circuit board SPCB to be reduced. In this case, a plurality of subpixels SP arranged in the same column line COL in an image display area ACT of the display panel 10 can share the defect detector 14A disposed in the dummy area DMY. The defect detector 14A can be connected to the data line DL and the low-level power line PW2 arranged in the same column line COL.

The defect detector 14A can be provided in a plurality in the dummy area DMY of the display panel 10. The plurality of defect detectors 14A can respectively correspond to a plurality of column lines COL.

Referring to FIG. 6, the comparator COMP and the first and second switches SW1 and SW2 configuring the defect detector 14A can be disposed on a source printed circuit board SPCB connected to the data driver through a flexible circuit film COF. In this case, a plurality of subpixels SP arranged in the same column line COL in the display panel 10 can share the defect detector 14A disposed in the source printed circuit board SPCB. The defect detector 14A can be connected to the data line DL and the low-level power line PW2 arranged in the same column line COL.

The defect detector 14A can be provided in plurality on the source printed circuit board SPCB. The plurality of defect detectors 14A can respectively correspond to a plurality of column lines COL.

The comparator COMP can be connected to the timing controller 11.

Referring to FIG. 7, the comparator COMP and the first and second switches SW1 and SW2 configuring the defect detector 14A can be disposed in a source IC SIC for implementing the data driver. Compared with other display sensing configurations, the use of the defect detector (including the comparator COMP) described herein can allow omission of one or more sensing components (for example a sensing transistor) in each pixel and associated ADC components in the source IC SIC. The placement of the comparator COMP in the source IC SIC makes an efficient use of space and the need for redesigning the layout in other areas of the display to make room for the comparator COMP is minimized. In this case, a plurality of subpixels SP arranged in the same column line COL in the display panel 10 can share the defect detector 14A disposed in the source IC SIC. The defect detector 14A can be connected to the data line DL and the low-level power line PW2 arranged in the same column line COL.

A plurality of source ICs SIC can be needed for driving the display panel 10 having a large area, and one defect detector 14A can be provided in each of source IC SIC. The plurality of defect detectors 14A can respectively correspond to a plurality of column lines COL.

Figure 8:
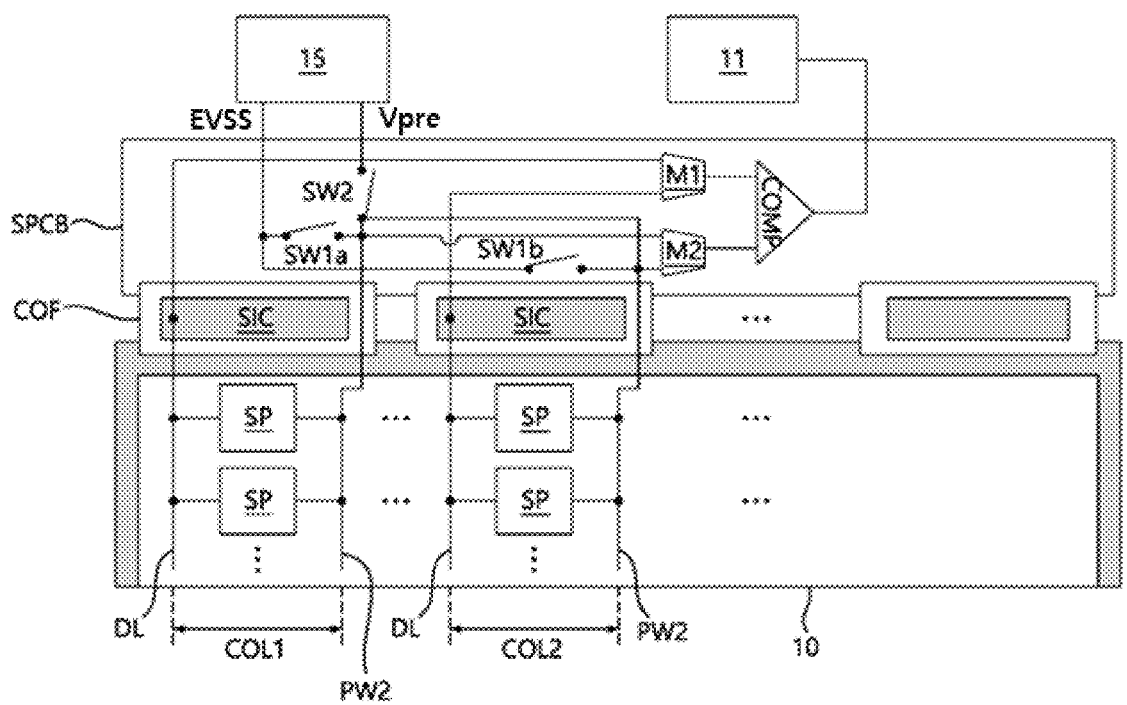

Referring to FIG. 8, the comparator COMP and the first and second switches SW1a, SW1b and SW2 configuring the defect detector 14A can be disposed on a source printed circuit board SPCB connected to the data driver through a flexible circuit film COF. In this case, a plurality of subpixels SP arranged in a plurality of column lines COL1 and COL2 in the display panel 10 can share one defect detector 14A disposed in the source printed circuit board SPCB. The defect detector 14A can be connected to a plurality of data lines DL and a plurality of low-level power lines PW2 arranged in the plurality of column lines COL1 and COL2 and can detect defects of subpixels by block units including the plurality of column lines COL1 and COL2.

A first multiplexer M1 can be connected between the comparator COMP and a plurality of data lines DL, and a second multiplexer M2 can be connected between the comparator COMP and a plurality of low-level power lines PW2. The first multiplexer M1 can selectively connect any one of the plurality of data lines DL to the comparator COMP. The second multiplexer M2 can selectively connect any one of the plurality of low-level power lines PW2 to the comparator COMP. A data line of the plurality of data lines DL is selected through the first mux M1 and is connected to the first input terminal of the comparator COMP, and a low-level power line PW2 of the plurality of low-level power lines PW2 is selected through the second mux M2 and is connected to the comparator COMP is connected to the second input terminal.

The first and second switches SW1a and SW2 can be connected to the power circuit 15.

Compared with the arrangement examples of FIGS. 5 to 7, an arrangement example of FIG. 8 can decrease the number of comparators COMP, thus reducing manufacturing complexity and cost.

The embodiments of the present disclosure can realize the following effects.

In the present embodiments, since each of a data line and a low-level power line needed for driving of a subpixel is used as a detection line, a separate detection line for detecting a subpixel defect may not be needed.

Since the present embodiment applies a simple subpixel structure of an inverted type and does not need a separate detection line, the present embodiment can be easily applied to a display panel which has a high resolution and a large area requiring a high aperture ratio.

In the present embodiment, because a specific node voltage of a subpixel received through a low-level power line is double-sampled based on two detection reference voltages, the occurrence or not of a defect and a defect type can be effectively determined. Accordingly, in the present embodiment, by detecting and compensating for a hot spot defect caused by an abnormal short circuit, display quality can be enhanced and the lifetime and reliability of products can increase.

The effects according to the embodiments of the present disclosure are not limited to the above examples, and other various effects can be included in the specification.

According to an embodiment of the present disclosure, an electroluminescent display apparatus can include a display panel including at least one subpixel connected to a data line, a gate line, and a power line; and a comparator connected to the at least one subpixel through the data line and the low level power line to compare a first input voltage from the data line with a second input voltage from the low level power line to generate a comparison output, wherein the first input voltage is a preset reference voltage, and the second input voltage is a voltage of a specific node of the at least one subpixel capable of being shifted from an preset initialization voltage.

In such electroluminescent display apparatus, the reference voltage comprises a first reference voltage which is lower than the initialization voltage and a second reference voltage which is higher than the initialization voltage.

In such electroluminescent display apparatus, in a preset detection period, the comparator compares the first reference voltage with the voltage of the specific node of the at least one subpixel on the basis of a first sampling clock to generate a first comparison output and compares the second reference voltage with the voltage of the specific node of the at least one subpixel on the basis of a second sampling clock to generate a second comparison output.

Such electroluminescent display apparatus can further comprise a data driver supplying the first reference voltage to the data line in a preset detection period, and then, supplying the second reference voltage to the data line; and a power circuit generating the initialization voltage which is to be supplied to the specific node of the at least one subpixel through the low level power line, in an initialization period preceding the detection period.

Such electroluminescent display apparatus can further comprise a first switch connected between the low level power line and a low level power terminal so as to supply the specific node of the at least one subpixel with a low level driving voltage needed for driving of the at least one subpixel; and a second switch connected between the low level power line and an initialization power terminal so as to supply the initialization voltage to the specific node of the at least subpixel.

In such electroluminescent display apparatus, the first switch maintains an off state in the initialization period and the detection period, and the second switch maintains an on state in the initialization period and maintains an off state in the detection period.

In such electroluminescent display apparatus, the comparator, the first switch, and the second switch are disposed in a dummy area, which does not display an image, of the display panel, and a plurality of subpixels arranged in the same column line of the display panel share the comparator, the first switch, and the second switch disposed in the dummy area.

In such electroluminescent display apparatus, the comparator, the first switch, and the second switch are disposed on a source printed circuit board connected to the data driver, and a plurality of subpixels arranged in at least one column line of the display panel share the comparator, the first switch, and the second switch disposed on the source printed circuit board.

In such electroluminescent display apparatus, the comparator, the first switch, and the second switch are disposed in a source integrated circuit for implementing the data driver, and a plurality of subpixels arranged in the same column line of the display panel share the comparator, the first switch, and the second switch disposed in the source integrated circuit.

In such electroluminescent display apparatus, the at least one subpixel comprises: a light emitting device connected to a high level power terminal at one electrode thereof and supplied with a high level driving voltage needed for driving of the at least one subpixel through the high level power terminal; a driving element including a gate electrode connected to a first node, a first electrode connected to the other electrode of the light emitting device, and a second electrode connected to the specific node; a switch element connected between the data line and the first node; and a storage capacitor connected between the first node and the specific node.

According to an embodiment of the present disclosure, a display defect detection method of an electroluminescent display apparatus including at least one subpixel connected to a data line, a gate line, and a power line, can include receiving a first input voltage through the data line and receiving a second input voltage through the power line; and comparing the first input voltage with the second input voltage to generate a comparison output, wherein the first input voltage is a reference voltage, and the second input voltage is a voltage of a specific node of the at least one subpixel capable of being shifted from an initialization voltage.

In such display defect detection method, the reference voltage comprises a first reference voltage which is lower than the initialization voltage and a second reference voltage which is higher than the initialization voltage.

In such display defect detection method, the comparing the first input voltage with the second input voltage to generate the comparison output comprises: in a preset detection period, comparing the first reference voltage with the voltage of the specific node of the at least one subpixel on the basis of a first sampling clock to generate a first comparison output; and in the detection period, comparing the second reference voltage with the voltage of the specific node of the at least one subpixel on the basis of a second sampling clock to generate a second comparison output.

Such display defect detection method of the present disclosure can include supplying the initialization voltage to the specific node of the at least one subpixel through the power line in an initialization period preceding the detection period.

While the present disclosure has been particularly shown and described with reference to exemplary embodiments thereof, it will be understood by those of ordinary skill in the art that various changes in form and details can be made therein without departing from the scope of the present disclosure as defined by the appended claims.

What is claimed is:

1. An electroluminescent display apparatus comprising:
   a display panel including at least one subpixel connected to a first data line and a first low-level power line; and
   a first comparator connected to the at least one subpixel via the first data line and the first low-level power line,
   wherein the first comparator is arranged to compare a first input voltage from the first data line with a second input voltage from the first low-level power line to generate a comparison output,
   the first input voltage is a reference voltage, and
   the second input voltage is a voltage of a specific node of the at least one subpixel.

2. The electroluminescent display apparatus of claim 1, wherein the reference voltage comprises:
   a first reference voltage which is lower than an initialization voltage, and
   a second reference voltage which is higher than the initialization voltage.

3. The electroluminescent display apparatus of claim 2, wherein, in a preset detection period, the first comparator is arranged to:
   on receiving a first clock signal, compare the first reference voltage with the voltage of the specific node of the at least one subpixel to generate a first comparison output; and
   on receiving a second clock signal, compare the second reference voltage with the voltage of the specific node of the at least one subpixel to generate a second comparison output.

4. The electroluminescent display apparatus of claim 2, further comprising:
   a data driver arranged to supply the first reference voltage to the first data line in a detection period, and then supply the second reference voltage to the first data line; and
   a power circuit arranged to generate the initialization voltage which is to be supplied to the specific node of the at least one subpixel through the first low-level power line, in an initialization period preceding the detection period.

5. The electroluminescent display apparatus of claim 1, further comprising:
   a first switch connected between the first low-level power line and a low-level power terminal so as to supply the specific node of the at least one subpixel with a low-level driving voltage for driving the at least one subpixel; and
   a second switch connected between the first low-level power line and an initialization power terminal so as to supply an initialization voltage to the specific node of the at least one subpixel.

6. The electroluminescent display apparatus of claim 5, wherein the first switch maintains an off state in the initialization period and the detection period, and
   the second switch maintains an on state in the initialization period and maintains an off state in the detection period.

7. The electroluminescent display apparatus of claim 5, wherein the first comparator, the first switch, and the second switch are disposed on:
   a source printed circuit board connected to the data driver,
   a flexible circuit film,
   a source integrated circuit, or
   a dummy area of the display panel which does not display an image.

8. The electroluminescent display apparatus of claim 1, further comprising:
   a first plurality of subpixels arranged in a first column, the first plurality of subpixels comprising the at least one subpixel.

9. The electroluminescent display apparatus of claim 8, wherein the first plurality of pixels share the first comparator, the first switch, and the second switch.

10. The electroluminescent display apparatus of claim 8, wherein the display panel further includes a second plurality of subpixels connected to a second data line, and a second low-level power line,
    the first comparator is connected to the second plurality of subpixels via the second data line and the second low-level power line,
    the first comparator is arranged to compare a third input voltage from the second data line with a fourth input voltage from the second low-level power line to generate another comparison output,
    the third input voltage is another reference voltage, and
    the fourth input voltage is a voltage of a specific node of the second plurality of subpixels.

11. The electroluminescent display apparatus of claim 10, wherein in a first mode, the first comparator is connected to the first plurality of subpixels and in a second mode, the first comparator is connected to the second plurality of subpixels.

12. The electroluminescent display apparatus of claim 10, further comprising:
    a first switch connected between the first low-level power line and a low-level power terminal so as to supply the specific node of the first plurality of subpixels with a low-level driving voltage for driving of the first plurality of subpixels; and
    a second switch connected between each of the first and second low-level power lines and an initialization power terminal so as to supply an initialization voltage to the specific node of each of the first and second plurality subpixels; and
    a third switch connected between the second low-level power line and the low-level power terminal so as to supply the specific node of the second plurality of subpixels with a low-level driving voltage for driving of the second plurality of subpixels.

13. The electroluminescent display apparatus of claim 12, wherein the first comparator, the first switch, the second switch and the third switch are disposed on a source printed circuit board connected to the data driver through a flexible circuit film.

14. The electroluminescent display apparatus of claim 10, wherein the second plurality of subpixels is arranged in a second column.

15. The electroluminescent display apparatus of claim 1, wherein each subpixel comprises:
    a light emitting device connected to a high-level power terminal at one electrode thereof and supplied with a high-level driving voltage, the high-level driving voltage driving the at least one subpixel through the high-level power terminal;
    a driving element including a gate electrode connected to a first node, a first electrode connected to another electrode of the light emitting device, and a second electrode connected to the specific node;
    a switch element connected between the data line and the first node; and
    a storage capacitor connected between the first node and the specific node.

16. The electroluminescent display apparatus of claim 1, wherein the reference voltage is a preset reference voltage and an initialization voltage is a preset initialization voltage.

17. The electroluminescent display apparatus of claim 1, further comprising:
a data driver arranged to supply a data voltage via the first data line to the at least one subpixel, wherein the level of the data voltage is based on the comparison output.

18. The electroluminescent display apparatus of claim 1, wherein a defect in the at least one subpixel causes a floating voltage of the specific node to either increase or decrease from an initialization voltage applied thereto.

19. A display defect detection method of an electroluminescent display apparatus including at least one subpixel connected to a first data line, and a first low-level power line, the display defect detection method comprising:
receiving a first input voltage through the first data line and receiving a second input voltage through the first low-level power line; and
comparing the first input voltage with the second input voltage to generate a comparison output,
wherein the first input voltage is a reference voltage, and the second input voltage is a voltage of a specific node of the at least one subpixel.

20. The display defect detection method of claim 19, wherein the reference voltage comprises:
a first reference voltage which is lower than an initialization voltage, and
a second reference voltage which is higher than the initialization voltage.

21. The display defect detection method of claim 20, wherein the comparing the first input voltage with the second input voltage to generate the comparison output comprises:

in a detection period and in response to a first clock signal, comparing the first reference voltage with the voltage of the specific node of the at least one subpixel to generate a first comparison output; and in the detection period and in response to a second clock signal, comparing the second reference voltage with the voltage of the specific node of the at least one subpixel to generate a second comparison output.

22. The display defect detection method of claim 21, further comprising:
supplying the initialization voltage to the specific node of the at least one subpixel through the low-level power line in an initialization period preceding the detection period.

23. The display defect detection method of claim 19, further comprising:
supplying a data voltage via the first data line to the at least one subpixel,
wherein a level of the data voltage is based on the comparison output.

24. The display defect detection method of claim 19, wherein a defect in the at least one subpixel causes a floating voltage of the specific node to either increase or decrease from an initialization voltage applied thereto.

25. The display defect detection method of claim 19, wherein the comparing the first input voltage with the second input voltage to generate the comparison output is carried out in a period in which no image is displayed on a display panel of the electroluminescent display apparatus.

* * * * *